(12) United States Patent
Lin et al.

(10) Patent No.: US 8,133,097 B2
(45) Date of Patent: Mar. 13, 2012

(54) POLISHING APPARATUS

(75) Inventors: Yu-Liang Lin, Hsin-Chu (TW); Chien Ling Hwang, Hsin Chu (TW); Jean Wang, Hsin Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 378 days.

(21) Appl. No.: 12/437,315

(22) Filed: May 7, 2009

(65) Prior Publication Data

US 2010/0285723 A1 Nov. 11, 2010

(51) Int. Cl.
B24B 7/22 (2006.01)
B24B 57/02 (2006.01)
(52) U.S. Cl. ............... 451/60; 451/446; 451/288
(58) Field of Classification Search .......... 451/56, 451/60, 285–289, 443, 444, 36, 5
See application file for complete search history.

(56) References Cited

U.S. PATENT DOCUMENTS

| 6,106,369 | A | * | 8/2000 | Konishi et al. | 451/41 |
| 6,152,805 | A | * | 11/2000 | Takahashi | 451/36 |
| 6,162,112 | A | * | 12/2000 | Miyazaki et al. | 451/36 |
| 6,196,900 | B1 | | 3/2001 | Zhang et al. | |
| 6,203,412 | B1 | * | 3/2001 | Quek | 451/60 |
| 6,869,337 | B2 | * | 3/2005 | Boyd et al. | 451/41 |
| 6,908,371 | B2 | | 6/2005 | Janzen | |
| 6,945,856 | B2 | * | 9/2005 | Boyd et al. | 451/56 |
| 7,267,600 | B1 | | 9/2007 | Lin et al. | |
| 7,625,262 | B2 | * | 12/2009 | Abe et al. | 451/41 |

OTHER PUBLICATIONS

Marvin Bryan Shieh; Face-Up Chemical Mechanical Polishing: Kinematics and Material Removal Rate; Department of Mechanical Engineering; Massachusetts Institute of Technology; Jun. 2006; pp. 1-27.

* cited by examiner

*Primary Examiner* — Dung Van Nguyen
(74) *Attorney, Agent, or Firm* — Haynes and Boone, LLP

(57) ABSTRACT

A chemical mechanical polishing (CMP) device for processing a wafer is provided which includes a plate for supporting the wafer to be processed in a face-up orientation, a polishing head opposing the plate, wherein the polishing head includes a rotatable polishing pad operable to contact the wafer while the polishing pad is rotating, and a slurry coating system providing a slurry to the polishing pad for polishing the wafer.

18 Claims, 14 Drawing Sheets

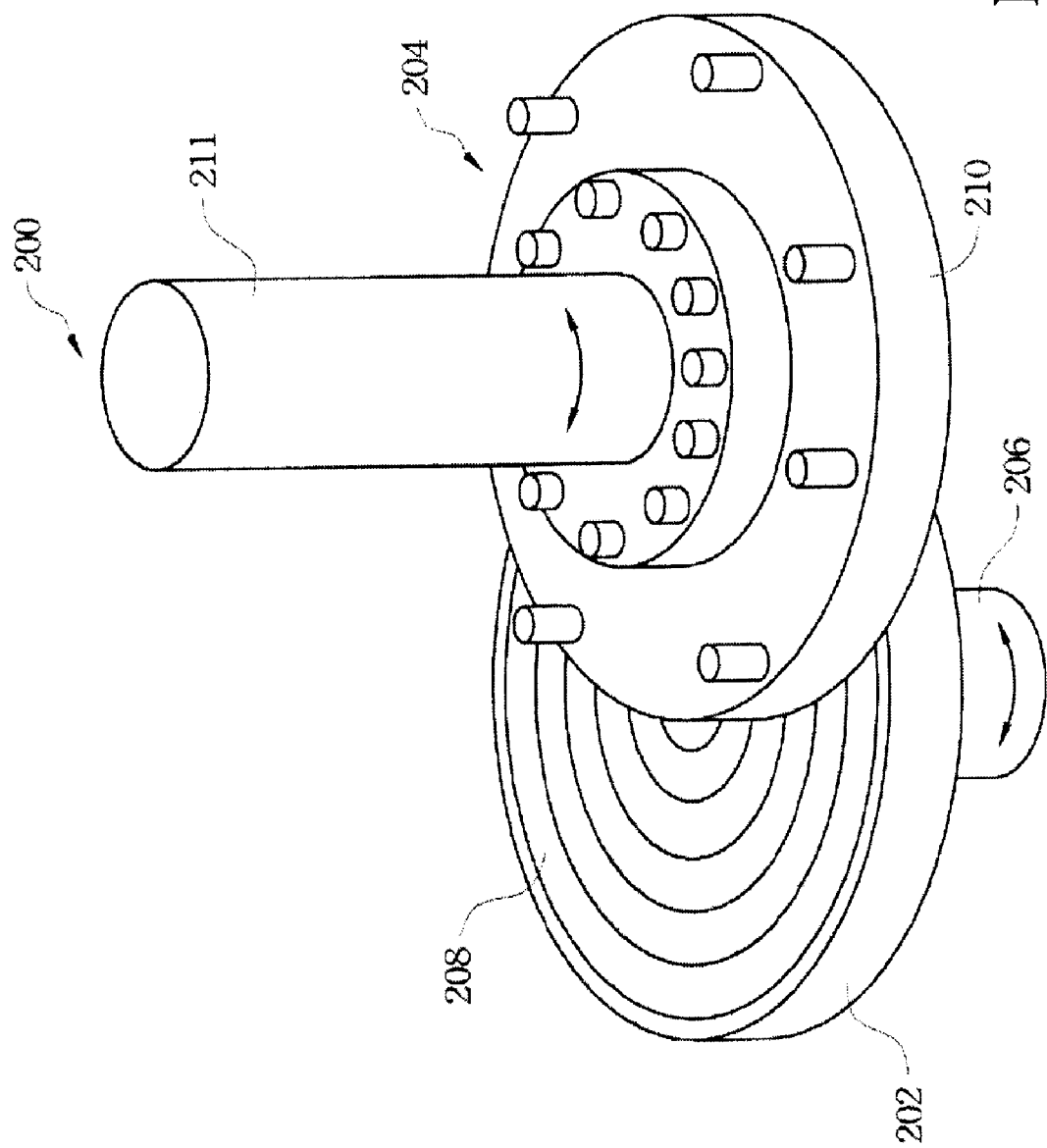

POLISHING APPARATUS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing systems and apparatuses are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also requires associated improvements in semiconductor manufacturing and processing equipment.

With advances in electronic products, semiconductor technology has been applied widely in manufacturing memories, central processing units (CPUs), display devices, light emitting diodes (LEDs), laser diodes and other devices or chip sets. In order to achieve high-integration and high-speed, dimensions of semiconductor integrated circuits have been reduced, and various materials and techniques have been proposed to achieve these targets and overcome obstacles during manufacturing. Due to the high-integration of semiconductor integrated circuits, the topography of a semiconductor integrated circuit on a substrate becomes rough and the surface of the substrate should be planarized/polished to facilitate deposition of subsequent layers. In order to solve this problem, chemical mechanical polishing (CMP) technology has been used. For purposes of this disclosure, the terms substrate and wafer are well known in the art and are herein used interchangeably.

Traditionally, CMP processes have been used on wafers in a face-down orientation. For ultra low K CMP processes, low force on the membrane is needed. Unfortunately, conventional CMP equipment cannot generally meet this requirement for such low force on the membrane.

Further, the downward force used in polishing may cause the wafer to flex, thereby creating dishing or a non-uniform/non-planar profile (non-U %) on the surface of the wafer. Also, such substrate flexing may induce corrosion on the wafer.

Other problems associated with traditional face-down wafer processing include the fact that in-situ wafer monitoring is not available, post CMP cleaning of the wafer cannot be performed, EPD (endpoint detection) is harder to measure and a large amount of slurry (e.g., polishing compound) is needed to spread out and wet the polishing pad.

Accordingly, what is needed is an improved CMP device that addresses the above stated issues, and a method for using such CMP device.

SUMMARY

Embodiments of the present disclosure relate to a chemical mechanical polishing (CMP) device for processing a wafer. One embodiment includes a plate for supporting the wafer to be processed in a face-up orientation, a polishing head opposing the plate, wherein the polishing head includes a rotatable polishing pad operable to contact the wafer while the polishing pad is rotating and a slurry coating system providing a slurry to the polishing pad for polishing the wafer.

In one embodiment, a method for polishing a wafer includes supporting the wafer to be processed on a plate in a face-up orientation, rotating a polishing pad using a polishing head that opposes the plate, wherein the polishing pad contacts the wafer while the polishing pad is rotating and providing a slurry to the polishing pad for polishing the wafer.

The above and other features will be better understood from the following detailed description of the present embodiments of the invention that is provided in connection with the accompanying drawings.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

Following are brief descriptions of exemplary drawings. They are mere exemplary embodiments and the scope of the present invention should not be limited thereto.

FIGS. 1A-1E are various views of an embodiment of a face-up CMP processing apparatus.

DETAILED DESCRIPTION

Figure 1B:
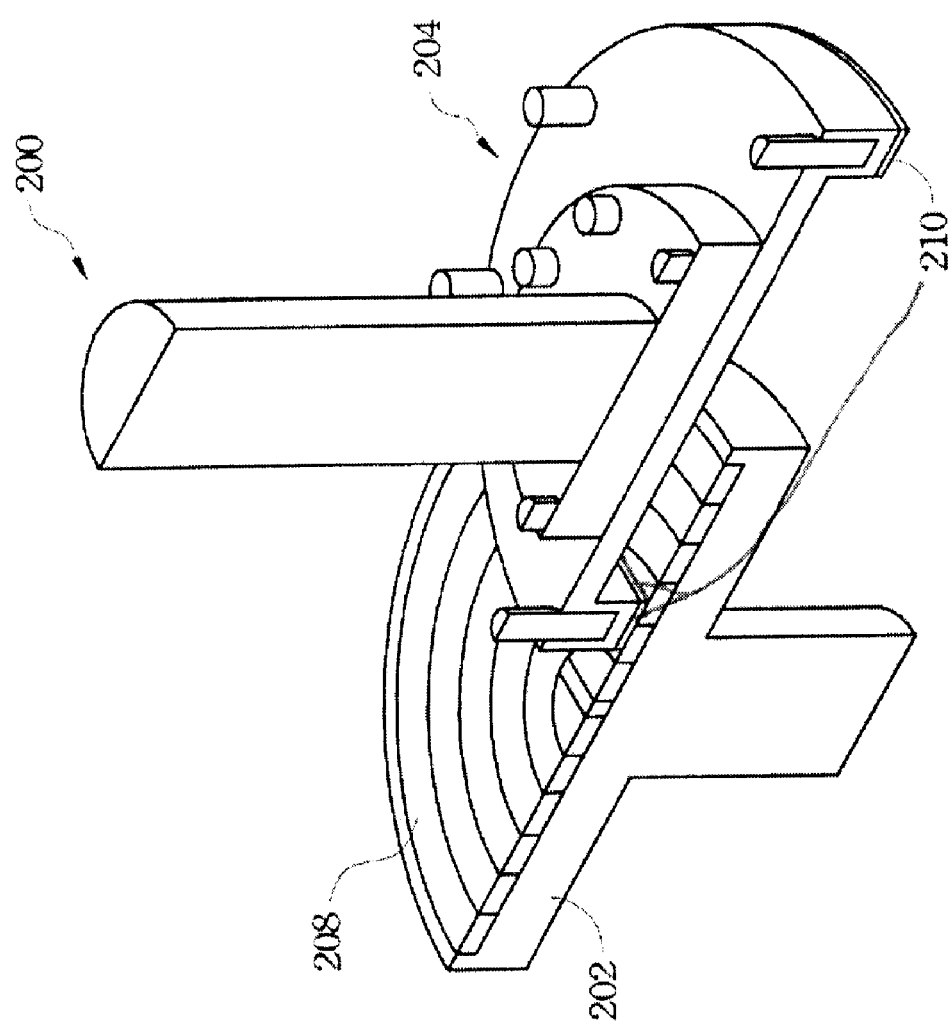

The present disclosure relates to a semiconductor substrate polishing apparatus, and, in various embodiments, more particularly to a chemical mechanical polishing (CMP) apparatus that enables face-up wafer CMP processes.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present invention relate to wafer face-up processing, including polishing, and a slurry delivery system to accommodate the face-up polishing, a ring-type polishing pad, insitu metrology for wafer face-up monitoring and post CMP cleaning using chemical nozzle and a brush.

With reference to FIGS. 1A through 8, apparatuses and methods of using the same are collectively described below. It is understood that additional steps can be provided before, during, and/or after the methods and some of the steps described below can be replaced or eliminated, for additional embodiments of the method. It is further understood that additional features can be added in the apparatuses and some of the features described below can be replaced or eliminated, for additional embodiments of the apparatuses. The present embodiments of the apparatuses and methods of using the same provide advanced technology CMP processes, especially for low force when processing low K wafers. Improvements may be realized in wafer U % (uniformity), planarity, dishing, erosion, polish endpoint detection, insitu-wafer monitoring and slurry/pad saving polishing of the wafer.

FIGS. 1A-1E show various views of an embodiment of a wafer face-up CMP processing system 200. FIG. 1A is an isometric view of the CMP processing system 200. FIG. 1B is a cut-away of the CMP processing system 200 of FIG. 1A. The system 200 may be used for processing semiconductor substrate wafers. In an embodiment, the system 200 is used to polish the wafer. The system includes, but is not limited to a wafer holder plate 202 and an opposing polishing head 204. In an embodiment, the wafer holder plate 202 is a rigid plate operable to hold the wafer to be processed on a top surface 208 of the wafer holder plate 202. Using a rigid plate 202, the wafer stays flat to minimize dishing erosions caused by wafer bending. The top surface 208 may include a high coefficient of friction to prevent the wafer under process from slipping. The wafer holder plate 202 may rotate about an axis 206 during the CMP processing. The polishing head 204 includes a disk around an outer portion of the polishing head 204 for holding a polishing pad 210. In an embodiment, the polishing pad 210 is a ring shape along a lower portion of the polishing head 204. However, other shapes of polishing pad 210 are contemplated. The polishing pad 210 contacts the wafer on the wafer holding plate 202 during polishing of the wafer. During operation, the polishing head 204 and the polishing pad 210 rotate about an axis 211. The polishing plate 202 and the polishing head 204 may rotate either direction about their respective axis 206, 211 and may rotate in the same direction and/or in opposite directions during polishing. The plate 202 and the polishing head 204 may rotate at any speed, including high and low speeds.

Figure 1C:
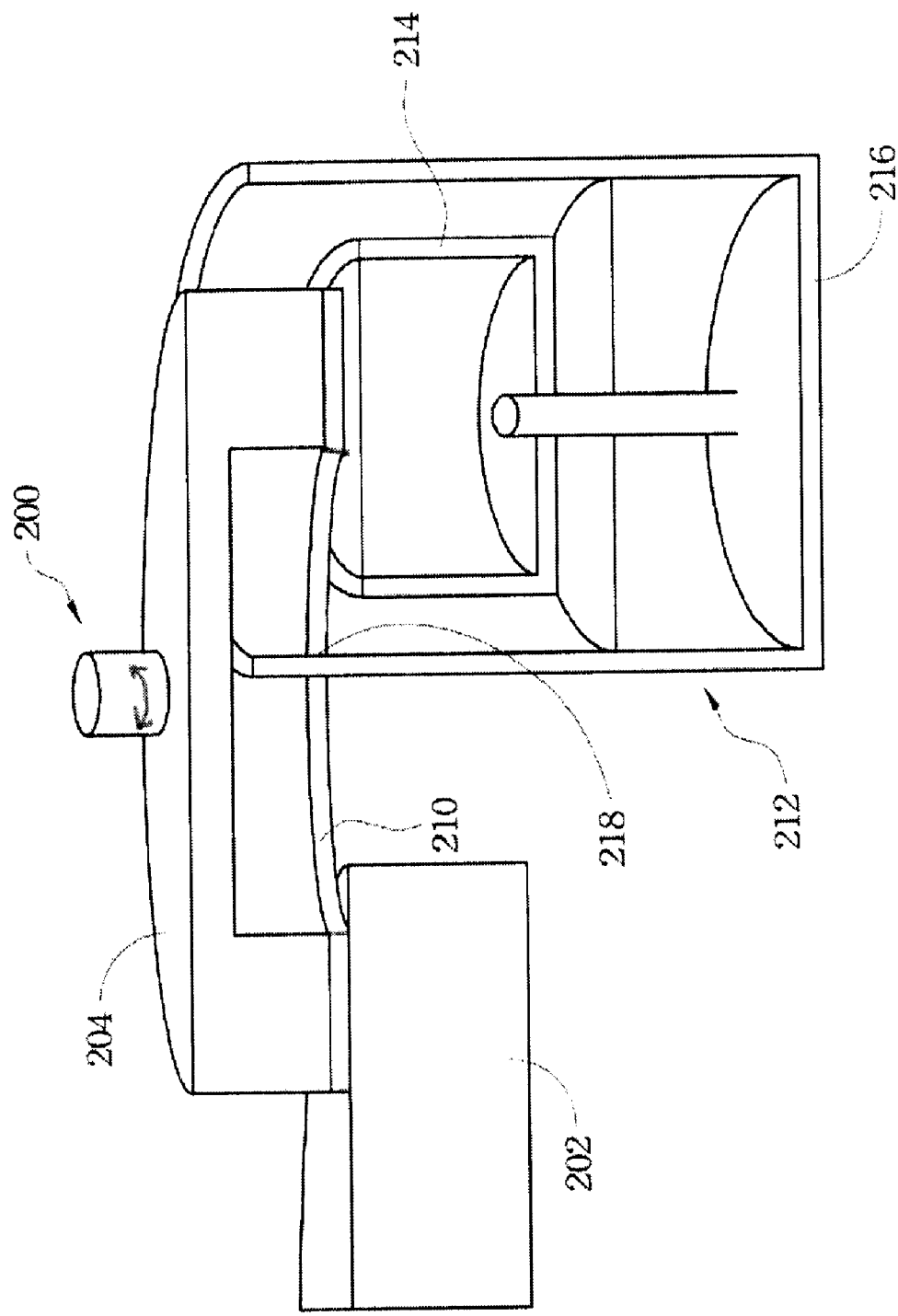

FIG. 1C shows a cut-away view of the CMP processing system 200 coupled with a polishing pad slurry coat system 212. The slurry coat system 212 includes a slurry cup 214 and an overflow tank 216. Also, as shown in FIG. 2B, the overflow tank 216 may include polishing pad slots 218 for the polishing pad 210 to pass through during rotation on the polishing head 204. The polishing pad slots 218 may or may not contact the polishing pad 210 as it rotates through the slots 218. If the polishing pad 210 contacts the slots 218 in the overflow tank 216, the slots 218 may act as a squeegee to clean excess slurry off of the polishing pad 210. The slurry is generally known in the art as a liquid having a suspended abrasive component that is used for lapping, polishing and grinding surfaces.

Figure 1D:
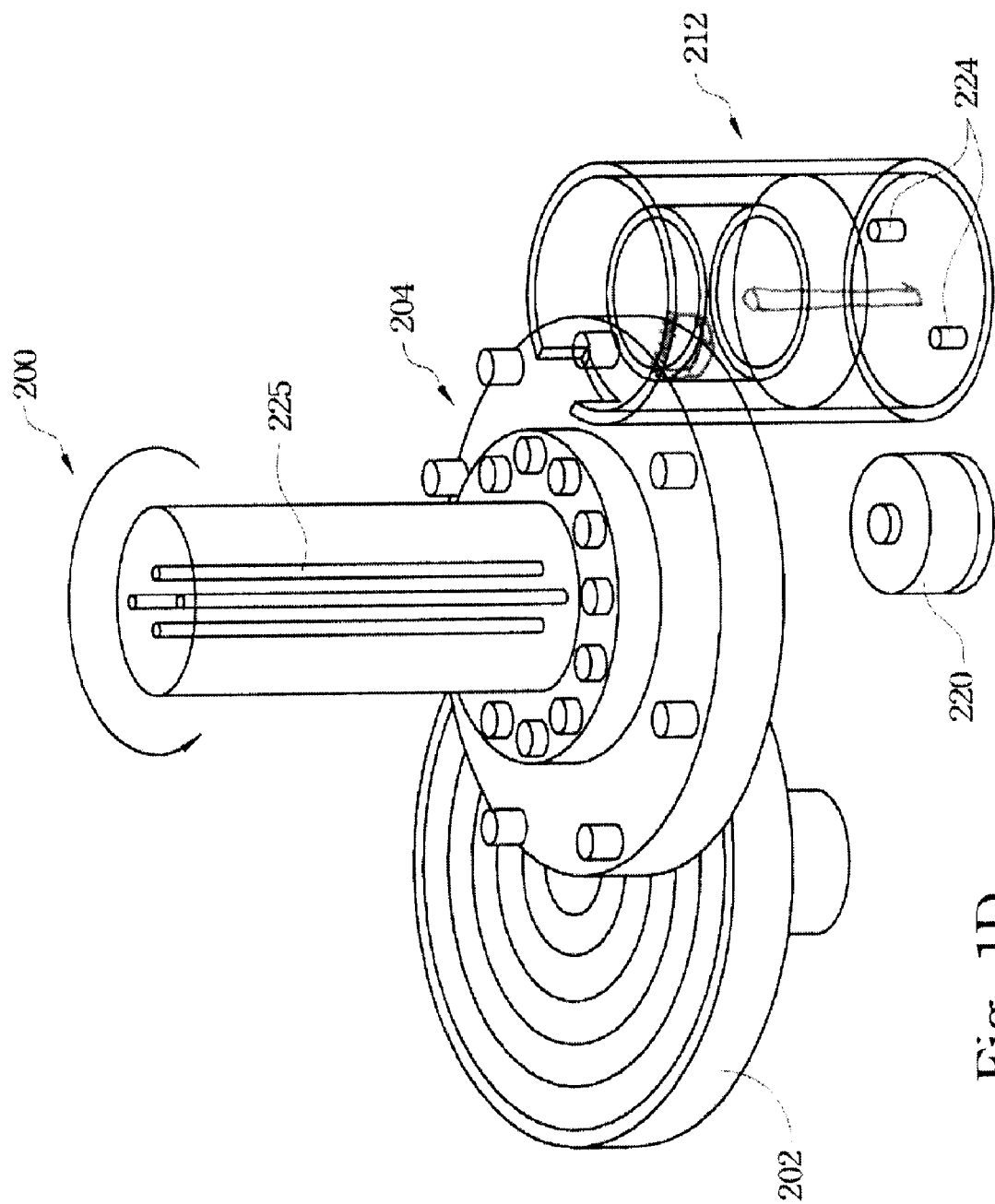
Figure 1E:
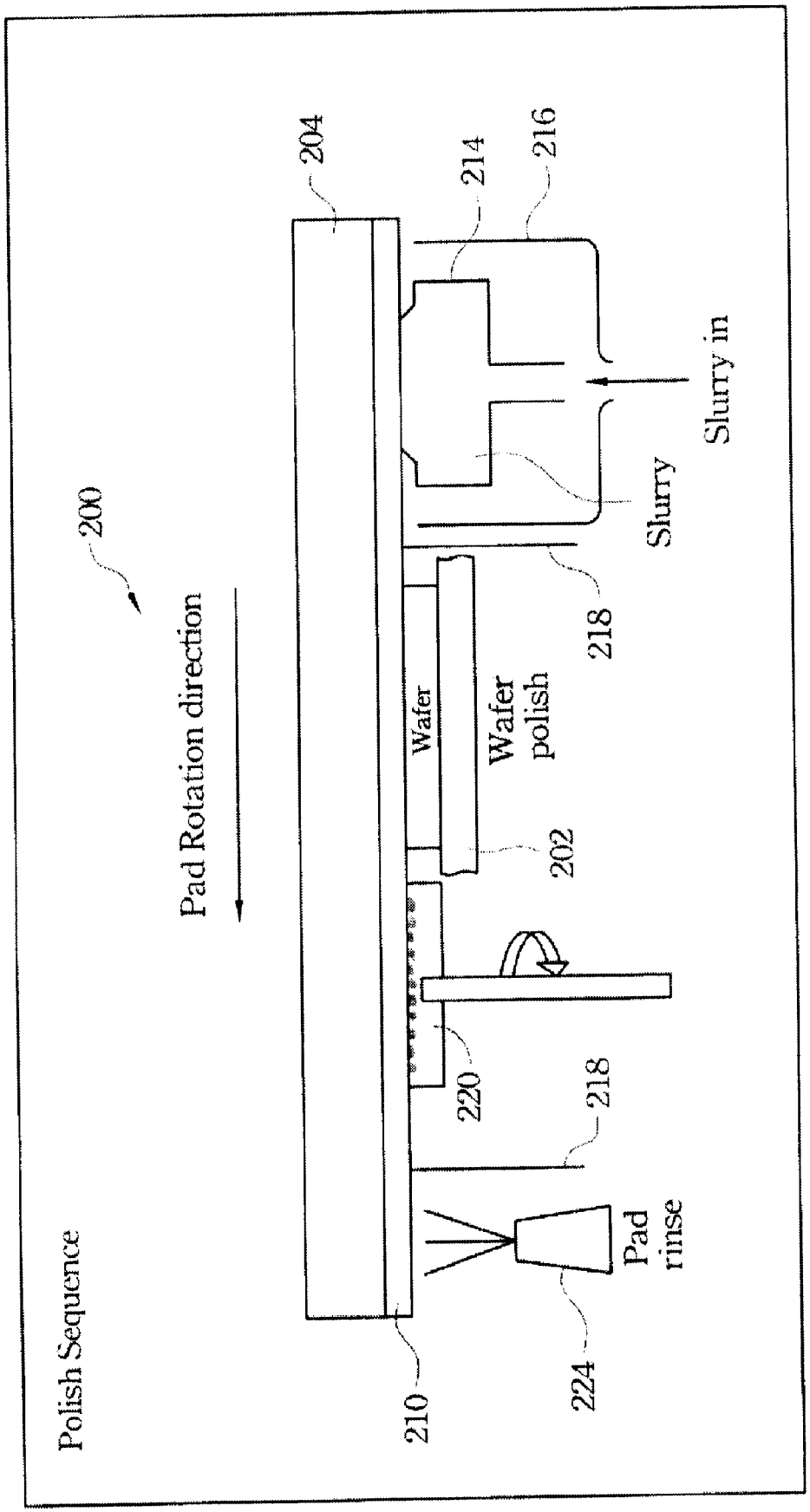

FIG. 1E shows a linear block diagram of a rotational polishing sequence using the slurry coating system 212 with the CMP processing system 200. A rotational view of this is shown in FIG. 1D. As the polishing pad 210 is rotating on the polishing head 204, the slurry is pumped upward in the slurry cup 214. As such, the slurry pushes upwards until it contacts the polishing pad 210. The polishing pad 210 rotates along with the polishing head 204 about the axis 211 towards the wafer to be polished on the surface 208 of the wafer plate 202. After the polishing pad 210 with the slurry contacts and wafer, the polishing pad 210 generally has abraded particles from the wafer that need to be cleaned from the polishing pad 210. Thus, after the polishing pad 210 passes from the wafer, the polishing pad 210 is contacted by a diamond disk 220 of a polishing pad conditioning system to condition the polishing pad 210. The conditioning of the polishing pad 210 by the diamond disk 220 may be constant as the polishing pad 210 is rotating or it may be intermittent as needed to keep the polishing pad 210 in good condition for polishing the wafer. In addition, the diamond disk 220 may rotate around an axis 222 so that different parts of the polishing pad 210 are contacted by different parts of the diamond disk 220 to condition the polishing pad 210. Then, continuing in the rotation, the polishing pad 210 passes through the first of the polishing pad slots 218 in the overflow tank 216. In an embodiment, the overflow tank 216 has one or more pad rinse nozzles 224. The pad rinse nozzles 224 spray a fluid (e.g., slurry, water, air, solvent, cleaner or any other suitable fluid) toward the polishing pad 210 to help rinse any foreign material, such as abraded particles from the wafer, away from the polishing pad 210 to keep the polishing pad 210 from clogging-up with the foreign material. Using the polishing pad slots 218 allows the pad rinse nozzles 224 to spray fluid at the polishing pad 210 without wasting the fluid. In other words, with the polishing pad 210 in the overflow tank 216, the deflected fluid falls back into the overflow tank 216 to be reused. The foreign material washed away by the fluid may settle out of the fluid and/or may be filtered out of the fluid by a filtering system. Then, the polishing pad 210 passes again over the slurry cup 214 to be supplied with slurry, then out the slot 218 and back to the wafer for polishing. This process repeats itself during polishing of the wafer as the polishing head 204 and the polishing pad 210 rotate. In an alternate embodiment, it is contemplated that one or more conduits 225 may provide slurry, polishing compound or other fluids to the polishing head 204 and/or the polishing pad 210.

Figure 2A:
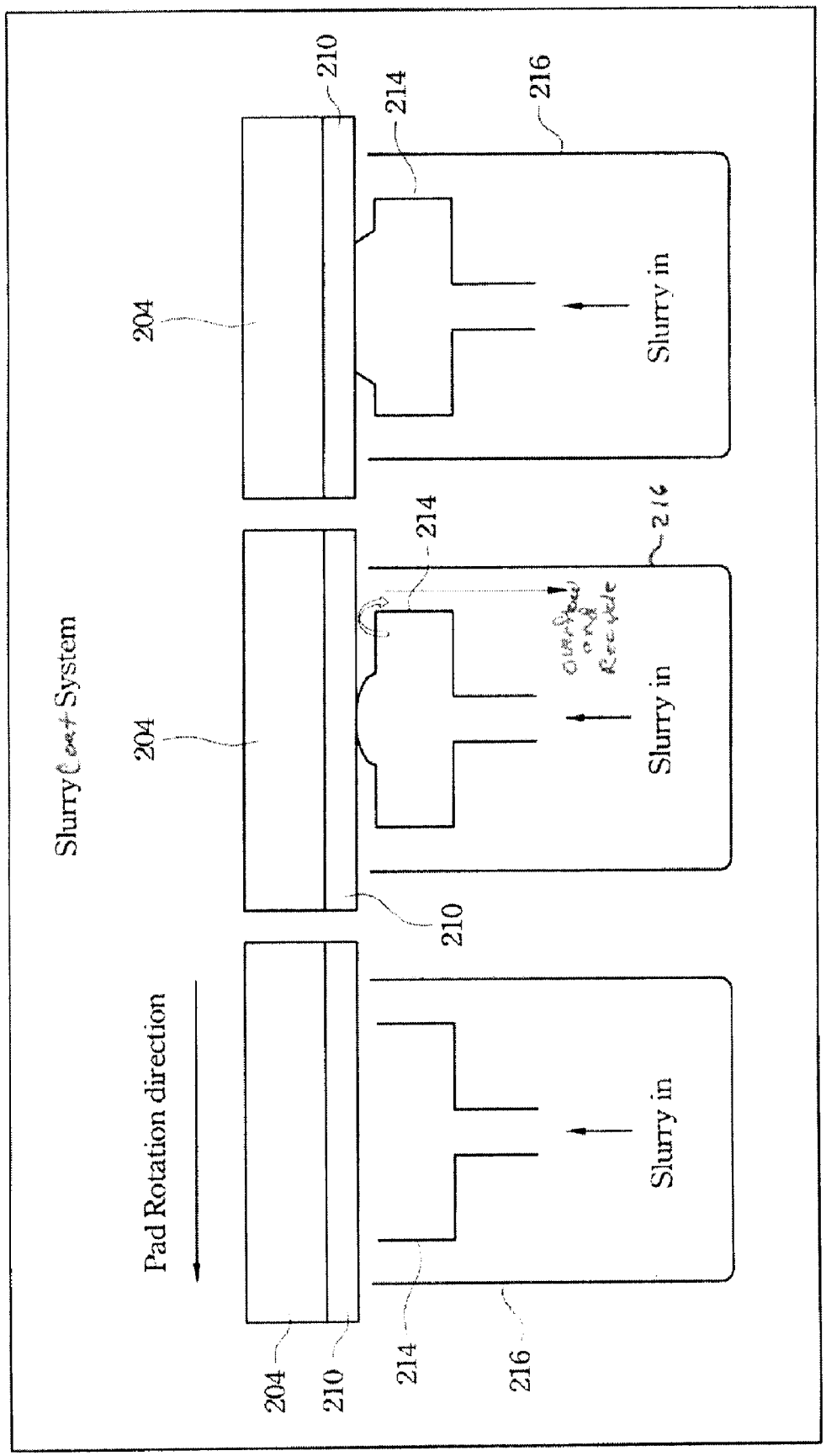
FIGS. 2A-2B are various views of embodiments of a slurry delivery system for the CMP processing apparatus of FIGS. 1A-1E.
Figure 2B:
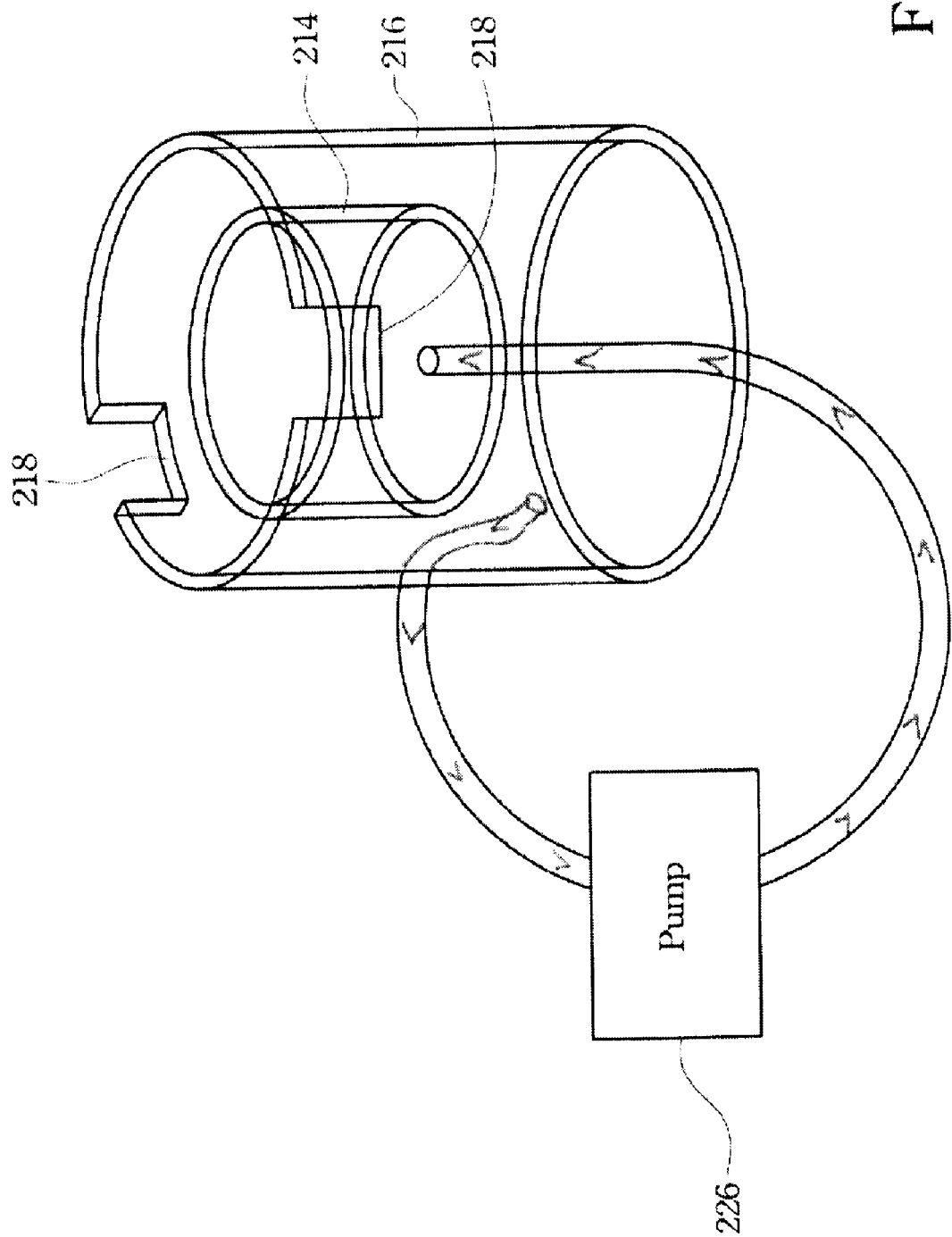

FIGS. 2A-2B show embodiments of a slurry overflow coating/delivery system 212 for the CMP processing system 200. A pump 226 pumps the slurry from the overflow tank 216 to the slurry cup 214. The pump 226 may be located within or outside of the overflow tank 216 or within the slurry cup 214. In addition, the pump 226 may supply the fluid to the pad rinse nozzles 224 shown in FIGS. 1D and 1E. As the slurry is pumped upwards, it fills the slurry cup 214 to the top. Some of the slurry will protrude up above the top of the slurry cup 214 and contact the polishing pad 210. As discussed above with respect to FIGS. 1C, 1D and 1E, the polishing pad 210 receives some of the slurry to carry to the wafer to be polished. However, more slurry may be pumped to the slurry cup 214 than can be used by the polishing pad 210 so the excess slurry will fall back from the slurry cup 214 to the overflow tank 216 to be recycled or re-circulated through the pump 226 to the slurry cup 214. As discussed above, the slurry or other fluid may be filtered (not shown). Recycling the slurry provides a higher utilization rate of the slurry (less waste) and creates movement of the slurry to reduce dead zones in slurry piping. In an embodiment, a wafer/ceramic/sapphire thinning tool may be modified by adding a down force indicating system and by adding a slurry delivery system to provide polishing of the wafer. In an embodiment, the polishing pad is rinsed by slurry overflow. The slurry flow amount may be controlled by the pump 226 used and the amount of slurry overflow area relating to the slurry cup 214.

Figure 3A:
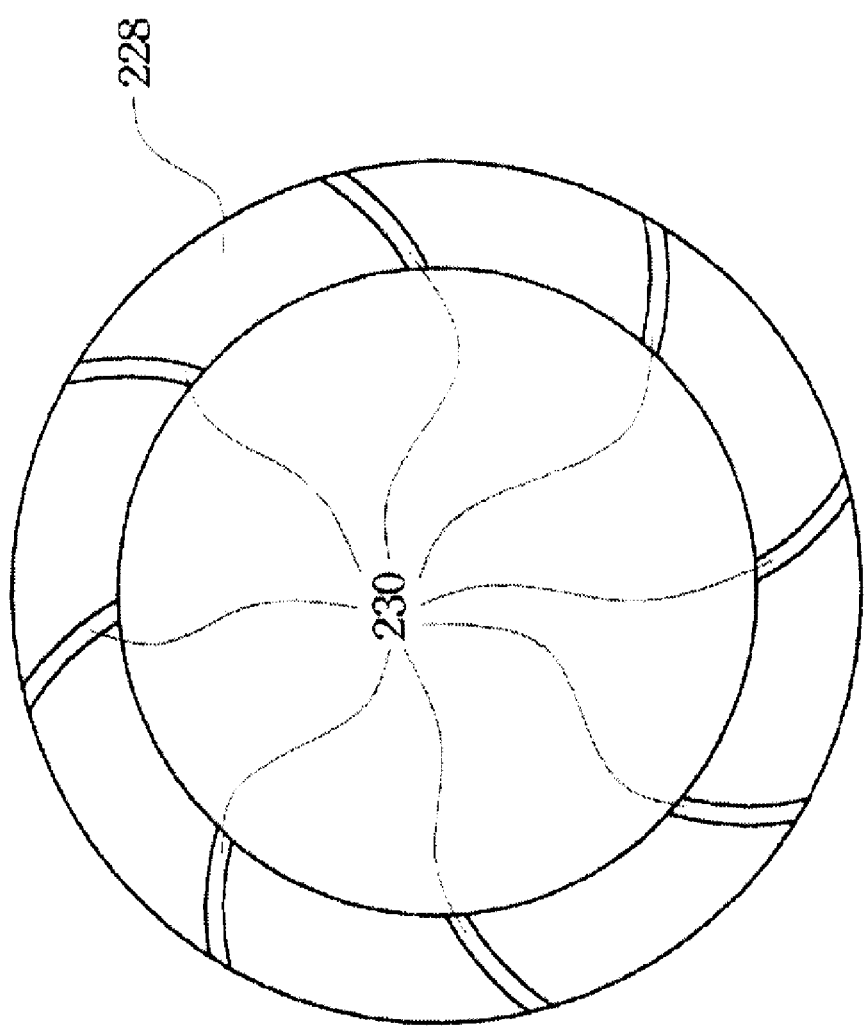
FIGS. 3A-3B are various views of embodiments of a polishing pad for use with the CMP processing apparatus of FIGS. 1A-1E.
Figure 3B:
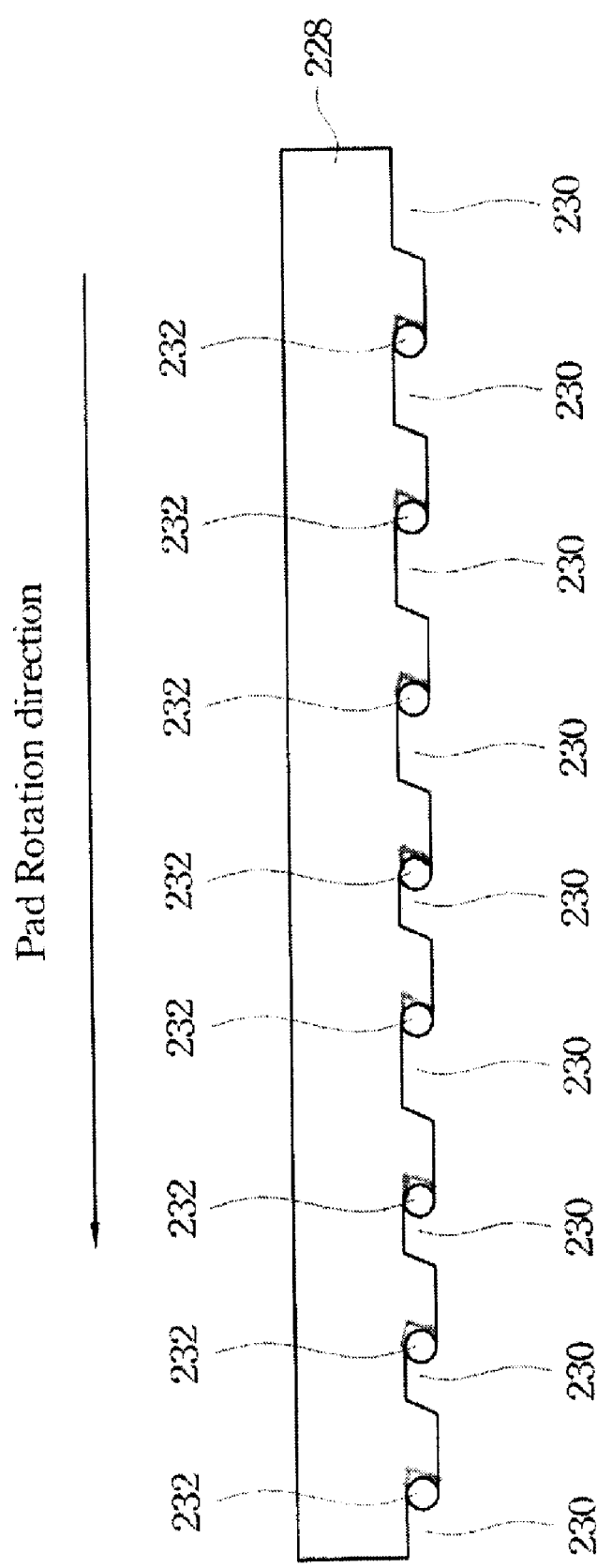

FIGS. 3A and 3B show a bottom and cross-section views respectively of an embodiment of a polishing pad 228 that may be used with the CMP processing system 200. This polishing pad 228 may be interchanged with the polishing pad 210, discussed above. This polishing pad 228 includes a plurality of distribution grooves 230 in the lower surface of the polishing pad 228 for receiving slurry and holding the slurry until it can be transported to the wafer for polishing the wafer. As the polishing pad 228, attached to the polishing head 204, rotates above the slurry cup 214, the distribution grooves 230 receive slurry that is above the slurry cup 214. The distribution grooves 230 may be shaped with an angular back wall 232. The angular back wall 232 is shaped so that when the polishing pad 228 is rotating at a high speed the centrifugal force exerted on the polishing pad 228 will hold the slurry up for transportation to the wafer for polishing. Then, as the polishing pad 228 contacts the wafer, the surface of the polishing pad 234 is soft or otherwise flexes so that the pressure exerted down by the polishing head 204 on the polishing pad 228 to the wafer causes the slurry to contact the wafer and abrade the wafer for polishing the wafer. As the polishing pad 228 rotates, the diamond disk 220 and the pad rinse nozzles 224 may clean and condition the polishing pad 228, including the distribution grooves 230, as discussed above with respect to FIGS. 1D and 1E.

Figure 4:
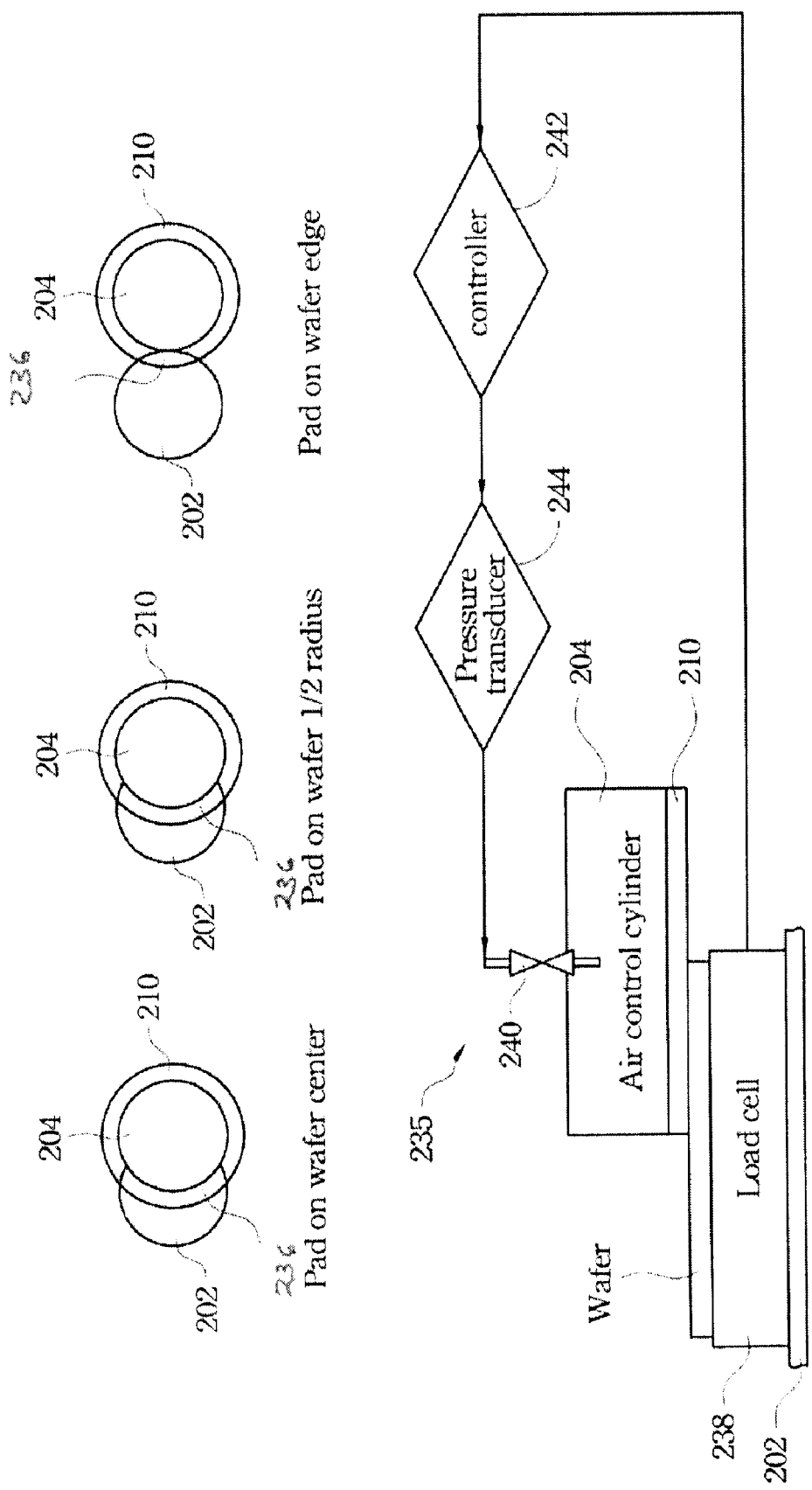
FIG. 4 is an embodiment of a closed loop control system for insitu down force monitoring of face-up wafer processing using the CMP processing apparatus of FIGS. 1A-1E.

FIG. 4 illustrates an embodiment of a closed loop control system 235 for insitu down-force monitoring of face-up wafer processing/polishing using the CMP processing apparatus 200. This system 235 monitors down force on the wafer during polishing of the wafer. As such, pressure, down force, can be better controlled to reduce loss of wafers by damage, especially on low K devices. As shown, a polishing zone 236 may be on the wafer center, the wafer ½ radius, or on the wafer edge. In addition, the polishing zone 236 may be on any point of the wafer to be polished. If a non-ring shaped polishing pad is used, a larger portion or all of the wafer may be polished. To change the polishing zone 236, the wafer plate 202 and/or the polishing head 204 may move relative to one another. In an embodiment of the system 235, a load cell 238 is associated with the wafer holder plate 202. The load cell 238 may be on the top surface 208 of the plate 202 or may be located anywhere else relative to the plate 202 so that the load cell 238 or a plurality of load cells (not shown) receive the force/pressure applied to the wafer by the air control cylinder 240 pressing down on the polishing head 204, which in turn, presses down the polishing pad 210. A pressure controller 242 receives signals from the load cell 238 about the down force applied to the wafer. The pressure controller 242 interprets the signals from the load cell 238 and sends a signal to a pressure transducer 244 indicating the amount of force that should be applied by the air control cylinder 240. The load cell 238 provides real-time feedback to control the down force on the wafer during polishing. As such, wafer sweep and the down force can be adjusted center to edge U %. This helps to avoid film peeling or cracking on the wafer.

Figure 5:
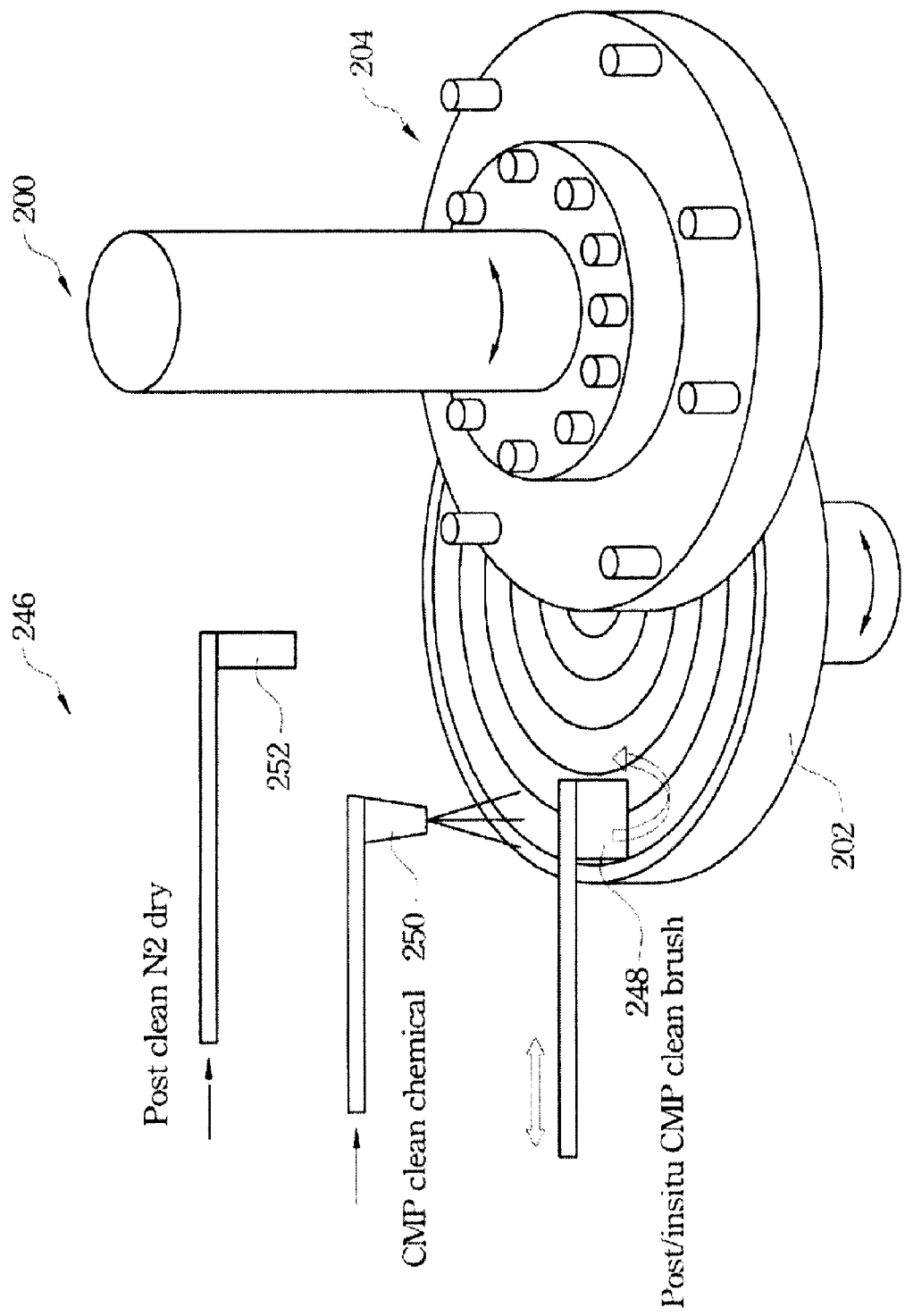
FIG. 5 is a view of an embodiment of an embedded CMP wafer cleaner apparatus using the CMP apparatus of FIGS. 1A-1E.

FIG. 5 illustrates an embodiment of an embedded CMP wafer cleaner apparatus 246 using the CMP processing system 200. The wafer cleaning apparatus 246 may be used as an insitu device to clean the wafer after polishing or other processing. An embodiment of the cleaner system 246 includes a clean brush 248, a cleaning chemical dispenser 250, and/or a post clean dryer 252. Thus, as the wafer rotates on the surface 208 of the holder plate 202, the wafer can be brushed (to remove larger particles), washed with a cleaning fluid, and dried. The clean brush 248, a cleaning chemical dispenser 250, and/or a post clean dryer 252 may be operable to move up and down and in and out with respect to the wafer to focus the cleaning to the desired area or areas of the wafer. In addition, the cleaning chemical dispenser 250, and/or the post clean dryer 252 may include one or more nozzles to adjust the spray of the cleaning fluid and/or the drying air as desired. The clean brush 248 should be fabricated from a material that will not damage the wafer. In addition, the wafer may be spun on the plate 202 at a high speed to "spin dry" the wafer. Using the cleaner apparatus 246 will benefit wafer production by reducing wafer per hour (WPH) cost by reducing a secondary operation on a separate cleaning device and by minimizing post CMP waiting time to clean the wafer.

Figure 6:
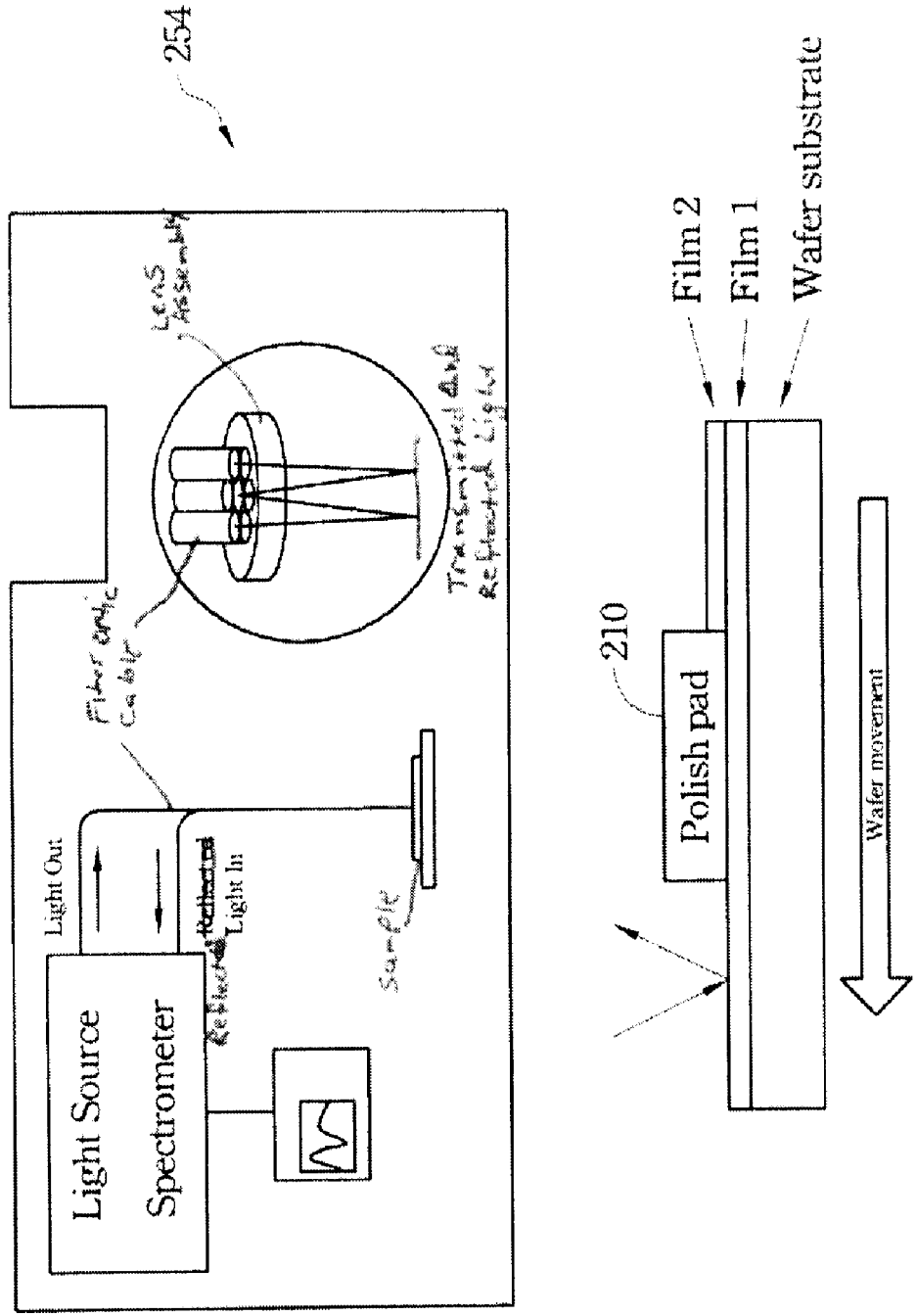
FIG. 6 is a view of an embodiment of a system for insitu wafer thickness/RI/n, k monitoring during CMP processing using the CMP apparatus of FIGS. 1A-1E.

FIG. 6 illustrates an embodiment of an insitu monitoring metrology system 254 for insitu wafer thickness/RI/n, k monitoring during CMP processing using the CMP processing system 200. It is to be understood that insitu generally relates to operations within a process reactor, metrology generally relates to measurements, and thus an insitu monitoring metrology system is a system operable to measure items within a process reactor. Systems for monitoring thickness of wafers during wafer manufacturing are commonly known in the art, but they require secondary operations and secondary devices to perform the monitoring. Using the CMP processing system 200 the monitoring equipment, such as the light source, the lens assembly and/or the spectrometer, may be incorporated into CMP processing system 200 insitu, thereby saving cost and processing time. In an embodiment, the monitor system 254 measures layer structures of single and multi layer stacks and freestanding films using optical constants of samples.

Figure 7:
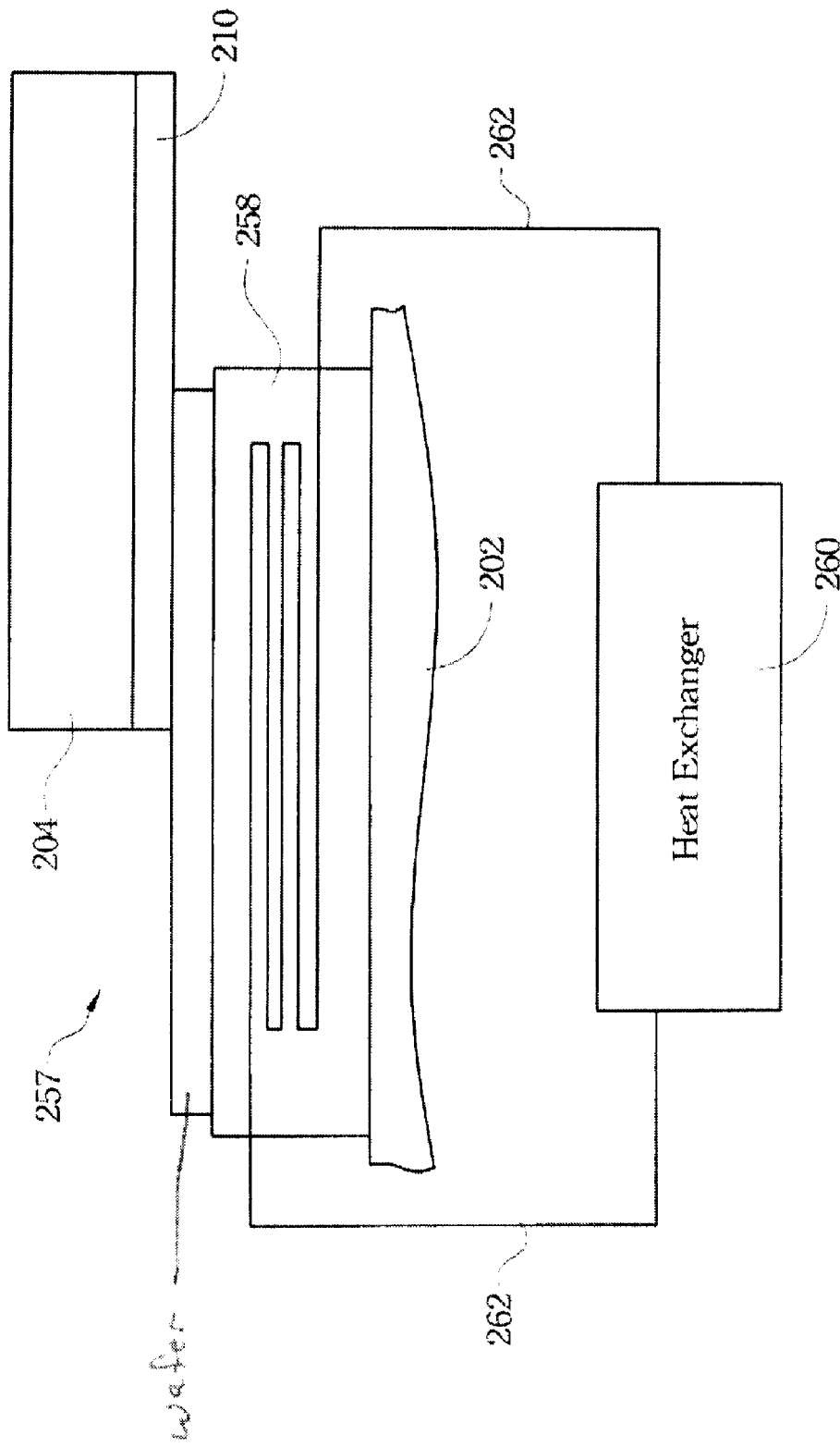
FIG. 7 is a view of an embodiment of a system of wafer backside temperature control for processing the wafer using the apparatus of FIGS. 1A-1E.

FIG. 7 is a view of an embodiment of a wafer temperature control system 257 to control wafer temperature during processing of the wafer using the CMP processing system 200. In an embodiment, a coil or other type of heat exchanger 258 couples with the plate 202 and interfaces with the wafer to transfer heat to or from the wafer. In an embodiment, the heat exchanger 258 is placed directly under the wafer. However, the heat exchanger 258 does not have to be directly touching the wafer as long as anything between the heat exchanger and the wafer allows heat to transfer between the heat exchanger and the wafer. Heat delivered by or absorbed from the heat exchanger 258 is transferred to second heat exchanger 260 via fluid lines 262. The transfer of heat between the heat exchangers 258 and 260 may take place using any manor of heat exchange.

Figure 8:
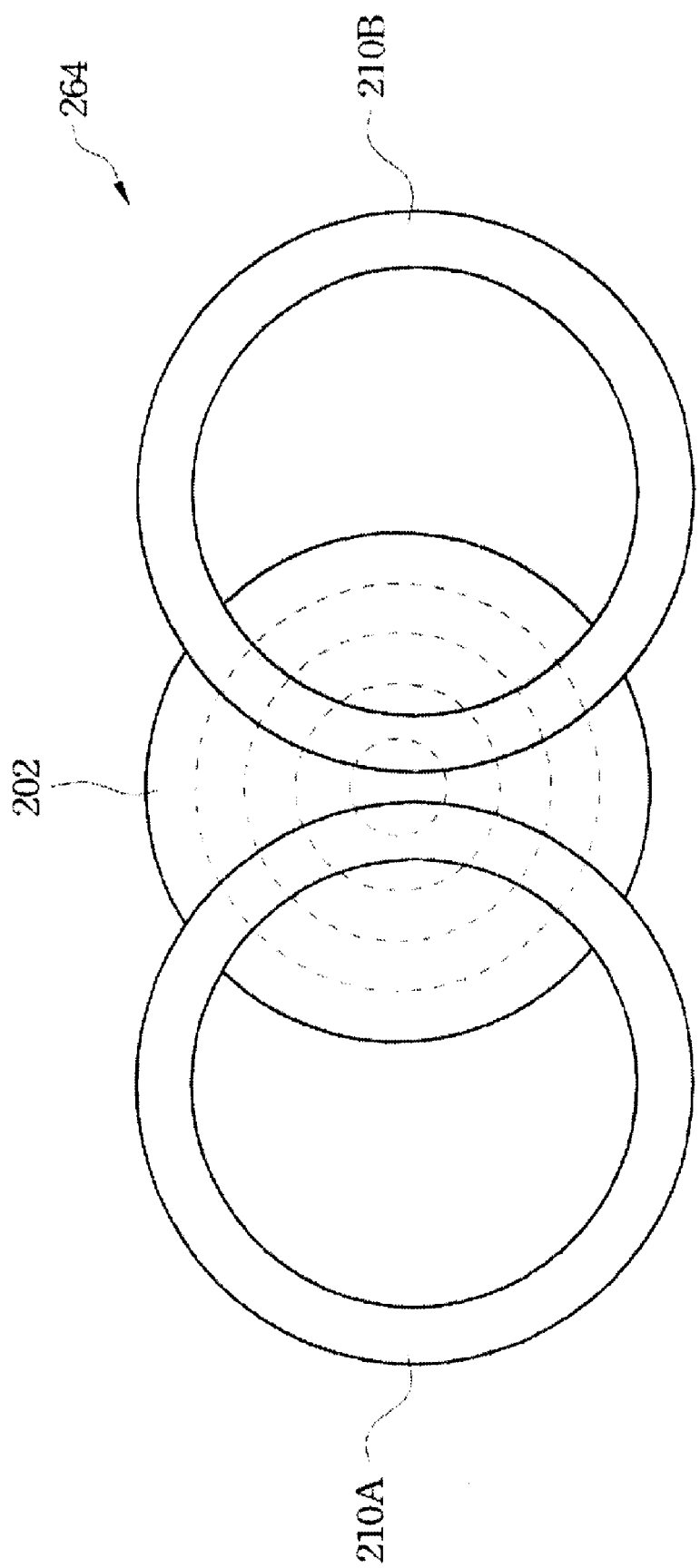
FIG. 8 is a view of a dual ring polisher for use with the CMP apparatus of FIGS. 1A-1E.

FIG. 8 is a view of a dual ring polisher 264 that may be used with the CMP processing system 200. As shown, the dual ring polisher 264 includes two polishing/processing pads 210A and 210B. Any number of polishing/processing pads 210 may be used with embodiments of the polisher 264. In an embodiment, one pad (e.g., 210A) may be used for thinning the wafer and one pad (e.g., 210B) may be used for polishing the wafer. In an embodiment, one pad (e.g., 210A) may be used for rough polishing the wafer and one pad (e.g., 210B) may be used for fine polishing the wafer. In an embodiment, a hybrid layer wafer with different pad 210 selectivity may be needed. In yet another embodiment, one pad (e.g., 210A) may provide insitu wafer cleaning and the other pad (e.g., 210B) may provide insitu wafer polishing. The plurality of pads 210 may be operating on the wafer at the same time, but do not have to be doing so. It is also noted that multiple slurry cup devices (e.g., 214) may be utilized with the CMP processing system 200.

Features of the foregoing should be readily apparent to those having ordinary skill in the art include, but are not limited to: ultra-low down force and fast rotation speed for ultra low K wafer polishing; reduced wafer bending from traditional membrane/retainer ring polishing, thereby creating better global planarity that in-turn saves scanner process window time; minimizes chemical reaction time for minimizing dishing and erosion for lithography processing; easier insitu wafer surface monitoring due to wafer being face-up; higher wafers per hour (WPH) processing rate due to embedded cleaner; a ring-type polishing pad having smaller surface area reducing use of slurry and allowing recycling of overflow slurry; accurate load cell monitoring of down force; insitu wafer thickness, n, k monitoring during polishing for accurate polish control; reducing cost for insitu post CMP equipment that is embedded into CMP stage; ultrasonic controlled processing and temperature controlled processing. It should also be readily apparent to those having ordinary skill in the art the foregoing applies to all sizes of wafers, including 450 mm wafers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical polishing (CMP) device for processing a wafer, the device comprising:
   a plate for supporting the wafer to be processed in a face-up orientation, a center portion of the plate being aligned along a first axis;
   a polishing head opposing the plate, wherein the polishing head includes a rotatable polishing pad operable to contact the wafer while the polishing pad is rotating, the rotatable polishing pad being configured to rotate about a second axis parallel to the first axis; and
   a slurry coating system providing a slurry to the polishing pad for polishing the wafer, a center portion of the slurry coating system being aligned along a third axis parallel to the first and second axes, wherein the first and third axes are radially spaced from the second axis such that when a first portion of the polishing pad is inside of the slurry coating system a second portion of the polishing pad spaced from the first portion is outside of the slurry coating system and in contact with the wafer, and wherein the slurry coating system recycles the slurry and includes:
   a slurry cup configured to deposit slurry onto the polishing pad; and
   an overflow tank surrounding the slurry cup and configured to collect excess slurry for reuse, the overflow tank including a polishing pad slot disposed in an exterior wall of the overflow tank and configured to remove excess slurry from the polishing pad as it passes therethrough.

2. The CMP device of claim 1, wherein the plate for supporting the wafer rotates about the first axis.

3. The CMP device of claim 1, further comprising:
   a polishing pad conditioning system to condition the polishing pad while the polishing pad is rotating via the polishing head.

4. The CMP device of claim 1, further comprising:
   an insitu wafer cleaning device operable to clean the wafer while the wafer is supported by the plate.

5. The CMP device of claim 1, further comprising:
   an insitu monitoring metrology system operable to monitor the wafer while the wafer is being supported by the plate.

6. The CMP device of claim 1, wherein the polishing pad is ring-shaped.

7. A method of polishing a wafer, the method comprising:
   supporting the wafer to be processed on a plate in a face-up orientation;
   rotating a polishing pad using a polishing head that opposes the plate, wherein the polishing pad contacts the wafer while the polishing pad is rotating; and
   providing a slurry to the polishing pad for polishing the wafer, wherein the providing the slurry includes:
   passing the polishing pad through a slurry coating system spaced from the plate;
   depositing slurry onto the polishing pad with a slurry cup inside of the slurry coating system;
   removing excess slurry from the polishing pad by passing the polishing pad through polishing pad slots in the slurry coating system after the depositing;
   collecting the excess slurry in an overflow tank in the slurry coating system after the depositing; and
   recycling the excess slurry in the overflow tank by pumping it back to the slurry cup.

8. The method of claim 7, further comprising:
rotating the plate.

9. The method of claim 7, further comprising:
conditioning the polishing pad while the polishing pad is rotating via the polishing head.

10. The method of claim 7, further comprising:
cleaning the wafer insitu while the wafer is supported by the plate.

11. The method of claim 7, further comprising:
insitu monitoring of the wafer, while the wafer is being supported by the plate.

12. The method of claim 7, further comprising:
transferring heat to or away from the wafer while the wafer is being supported by the plate.

13. A system for polishing wafers, the system comprising:
   a plate for supporting the wafer to be processed in a face-up orientation;
   a polishing head opposing the plate, wherein the polishing head includes a ring-shaped, grooved polishing pad operable to contact the wafer while the polishing pad is rotating; and
   a recycling slurry coating system providing a slurry to the polishing pad for polishing the wafer, wherein the recycling slurry coating system is configured to receive a portion of the polishing pad therein while the polishing pad is rotating, and wherein the recycling slurry coating system includes:

a slurry cup configured to deposit slurry into grooves of the portion of the polishing pad received by the slurry coating system while the polishing pad is rotating;

an overflow tank surrounding the slurry cup and configured to collect excess slurry for reuse, the overflow tank including a polishing pad slot disposed in an exterior wall of the overflow tank and configured to receive the portion of the polishing pad while the polishing pad is rotating, the polishing pad slot being further configured to remove excess slurry from the portion of the polishing pad as it passes therethrough.

14. The system of claim 13, wherein the slurry coating system recycles the slurry by capturing excess slurry in the overflow tank and pumping it back to the slurry cup.

15. The system of claim 13, wherein the plate for supporting the wafer moves relative to the polishing head.

16. The system of claim 13, further comprising:
a polishing pad conditioning system to condition the polishing pad using a diamond disk while the polishing pad is rotating.

17. The system of claim 13, further comprising:
a wafer cleaning device operable to clean and dry the wafer while the wafer is supported by the plate.

18. The system of claim 13, further comprising:
a closed-loop down force control system to regulate pressure of the polishing pad on the wafer in real-time.

* * * * *